United States Patent [19]

Kuramitsu et al.

[11] Patent Number: 4,781,244
[45] Date of Patent: Nov. 1, 1988

[54] LIQUID COOLING SYSTEM FOR INTEGRATED CIRCUIT CHIPS

[75] Inventors: Yuji Kuramitsu; Yukio Yamaguchi, both of Tokyo, Japan

[73] Assignee: NEC Corporation, Tokyo, Japan

[21] Appl. No.: 18,408

[22] Filed: Feb. 25, 1987

[30] Foreign Application Priority Data

Feb. 25, 1986 [JP] Japan .............................. 61-26175[U]
Nov. 7, 1986 [JP] Japan ................................. 61-265195

[51] Int. Cl.⁴ ................................................ F28F 7/00
[52] U.S. Cl. .................................... 165/80.4; 165/185; 361/388
[58] Field of Search ................. 165/80.4, 185; 357/81, 357/79; 361/386, 387, 388

[56] References Cited

U.S. PATENT DOCUMENTS

| | | | |
|---|---|---|---|
| 4,109,707 | 8/1978 | Wilson et al. | 165/80.4 X |
| 4,245,273 | 1/1981 | Feinberg et al. | 361/382 |
| 4,282,924 | 8/1981 | Faretra | 165/80.4 X |
| 4,546,410 | 10/1985 | Kaufman | 361/387 |
| 4,574,879 | 3/1986 | DeGree et al. | 165/185 |
| 4,602,125 | 7/1986 | West et al. | 165/185 X |
| 4,602,678 | 7/1986 | Fick | 165/185 X |
| 4,644,385 | 2/1987 | Nakanishi et al. | 361/385 |
| 4,666,545 | 5/1987 | DeGree et al. | 156/252 |

OTHER PUBLICATIONS

IBM Technical Bulletin, "Method of Effective Cooling of a High Power Silicon Chip", vol. 20, No. 4, Sep. 1977.

Primary Examiner—Michael Koczo
Assistant Examiner—Peggy Neils
Attorney, Agent, or Firm—Burns, Doane, Swecker & Mathis

[57] ABSTRACT

A cooling system for an electronic system comprises a connector mounted on a panel and an integrated circuit package removably connected to the connector by a mounting frame. A layer of heat conductive bonding material is provided between the package and a heat conductive member which is removably secured to a water-cooling heat exchanger. A plurality of guide posts are secured to the panel for holding the heat exchanger. Each guide post is formed with an externally threaded portion which engages with a thumb nut. A coil spring is provided between each thumb nut and the heat exchanger to exert a predetermined amount of contact pressure between the connector and package and take the weight of the heat exchanger.

5 Claims, 2 Drawing Sheets

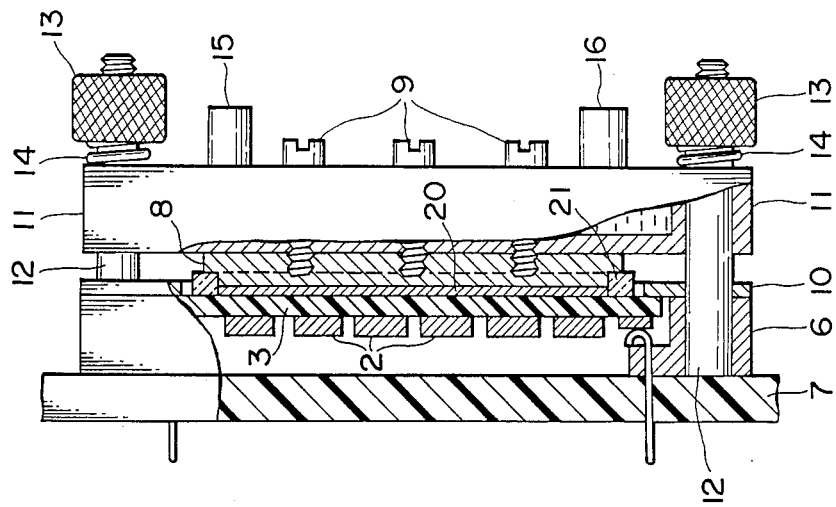
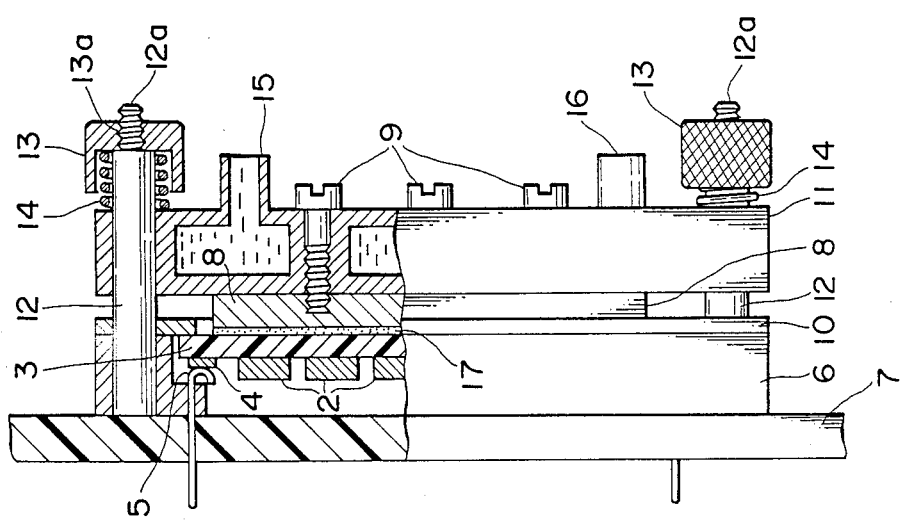

LIQUID COOLING SYSTEM FOR INTEGRATED CIRCUIT CHIPS

RELATED APPLICATION

This application is related to copending U.S. patent application Ser. No. 931,847, filed Nov. 18, 1986, M. Komoto et al, titled "Liquid Cooling System for Integrated Circuit Chips", assigned to the same assignee as the present application.

BACKGROUND OF THE INVENTION

The present invention relates to a liquid cooling system for integrated circuits.

A prior art cooling system for large scale integrated circuit chips as shown and described in U.S. Pat. No. 4,072,188 issued to E. A. Wilson et al involves the use of a liquid coolant heat exchanger having a flexible, heat conductive wall. The heat exchanger is mounted so that the flexible wall is in close proximity to a surface of the substrate on the other surface of which the integrated circuit chips are mounted. A low thermal impedance contact is made through the flexible wall of the heat exchanger between the substrate to be cooled and the coolant flowing through the heat exchanger because of the pressure of the coolant in the heat exchanger.

The flexible wall of the heat exchanger is formed of copper and has a thickness in the range between 0.05 mm and 0.25 mm. Because of the small thickness of the flexible wall, the pressure of the coolant in the heat exchanger reaches a limit which is unacceptably lower than is required to maintain the temperature of the integrated circuit chips in the micropackage below their maximum operating temperature. In addition, during replacement or repair greatest care must be taken to ensure against possible breakage of the thin flexible wall of the heat exchanger, which could lead to the leakage of liquid coolant to micropackages.

SUMMARY OF THE INVENTION

It is therefore an object of the present invention to provide a liquid cooling system for integrated circuit chips which is capable of maintaining their operating temperature below their maximum operating temperature and of ensuring against possible leakage of liquid coolant during replacement or repair of a micropackage.

Specifically, the cooling system for an electronic system comprises a connector mounted on a panel, an integrated circuit package removably connectable to the connector, a mounting frame for mounting the package into contact with the connector, a heat exchanger means provided with inlet and outlet means to permit liquid coolant to flow through the heat exchanger, and a layer of heat conductive bonding material for bonding the heat exchanger means to the package to provide a low thermal resistance contact therebetween. A plurality of fastening means are mounted on the panel for removably holding the heat exchanger means.

Preferably, each of the fastening means comprises a guide post having a shaft portion and an externally threaded portion, a nut having an internally threaded portion engaging with the externally threaded portion, and a coil spring between the nut and the heat exchanger means. The coil spring exerts a predetermined amount of pressure when the nut is tightened to the shaft portion. The heat conductive layer is preferably composed of nonfluidic silicone compound which is surrounded by a wall of silicone rubber.

BRIEF DESCRIPTION OF THE DRAWINGS

The present invention will be described in further detail with reference to the accompanying drawings, in which:

FIG. 2 is a view in section of the embodiment of FIG. 1; and

FIG. 3 is a view in section of another embodiment of the invention.

DETAILED DESCRIPTION

Figure 1:
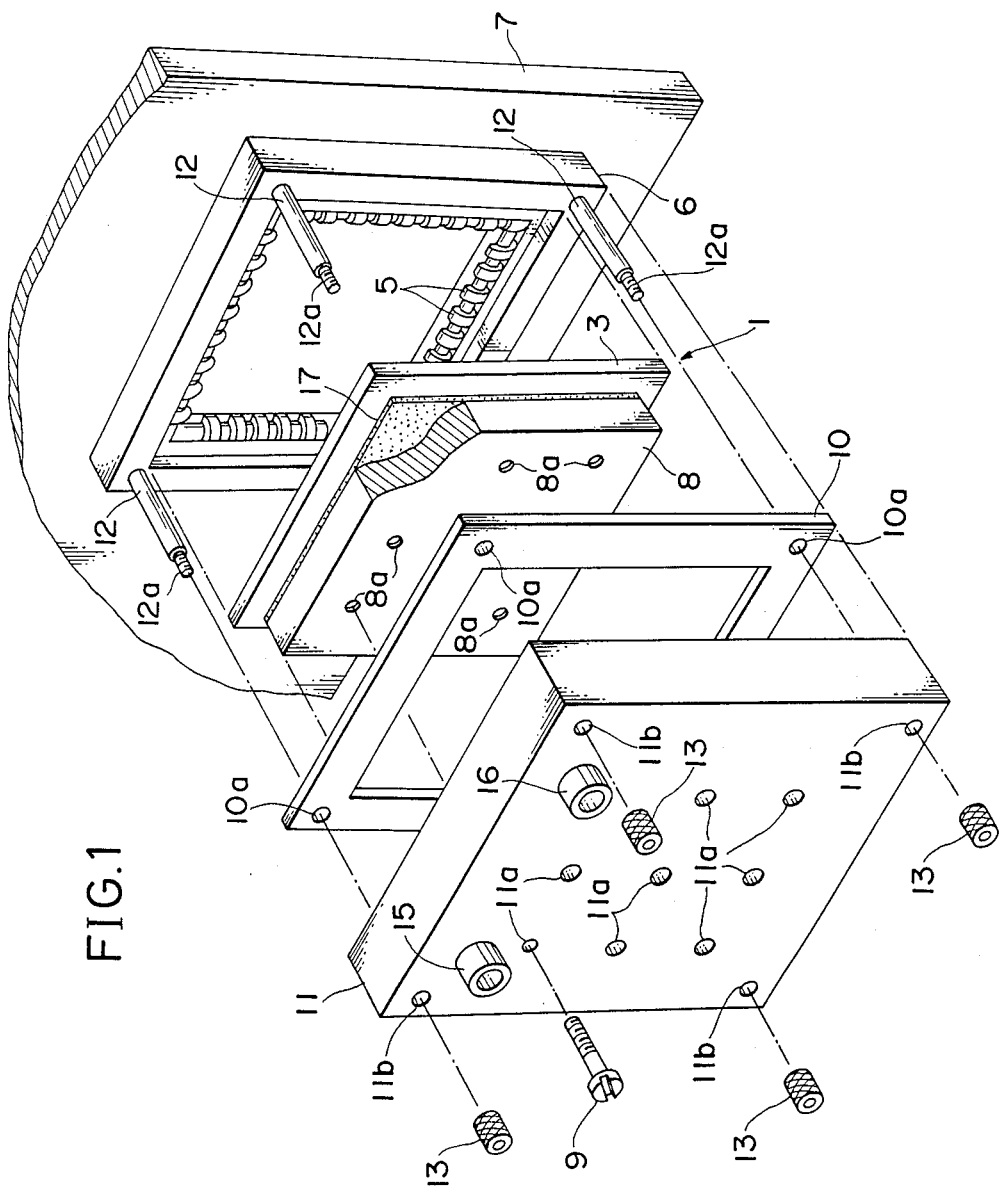
FIG. 1 is a perspective view of an embodiment of a liquid cooling system of the invention.

Referring to FIGS. 1 and 2, there is illustrated a multichip integrated circuit assembly or micropackage 1 which comprises a relatively large number, approximately 80, of large scale integrated circuit chips 2 mounted on one surface of a square printed circuit board or substrate 3 which is made of electrically nonconductive ceramic material such as aluminum oxide. The chips and details of the printed circuit are not illustrated since they form no part of the invention. Along the edges of the substrate 3 is formed a plurality of electrical contacts 4 which engage contacts 5 of connector 6. Connector 6 is fixedly mounted on a panel 7 which also has a printed circuit to permit the large scale integrated circuits 2 to be interconnected to form an electronic system.

To remove heat from micropackage 1 a surface of the substrate 3 opposite to integrated circuits 2 is in contact with a heat conductive member 8 which is formed with threaded screw holes 8a. Heat conductive member 8 is composed of a metallic substance such as copper or aluminum or a nonmetallic substance such as beryllium oxide or aluminum nitride. To ensure low thermal resistance contact between the substrate 3 and heat conductive member 8, the latter is cemented to the substrate by a layer 17 of heat conductive bonding material such as solder or silver-containing epoxy resin. If solder is used, the contact surface of substrate 3 should be metallized prior to soldering. Clearances which would otherwise occur between the heat conductive member 8 and substrate 3 are filled with the bonding material 17.

A water-cooling heat exchanger 11 is in face-to-face, low thermal resistance contact with the heat conductive member 8 by means of screws 9 which extend through holes 11a and are threadably engaged with screw holes 8a. At each corner of connector 6 is provided a guide post 12 formed with an externally threaded tip 12a. Each of the guide posts 12 extends through a corresponding hole 10a of a mounting frame 10 and a corresponding hole 11b of the heat exchanger 11. Mounting frame 10 holds the micropackage 1 in pressure contact with the connector 6. Each thumb nut 13 has an internally threaded hole 13a threadably engaged with the externally threaded tip 12a of a corresponding one of the guide posts 12. Each thumb nut 13 has an internal recess in which a coil spring 14 is disposed. The coil spring 14 exerts a predetermined amount of pressure on the heat exchanger 11 when the thumb nut 13 is tightened to the shoulder portion of the guide post 12 so that the weight of the whole unit (of which the greater portion is accounted for by the weight of the heat exchanger 11 and conductive member 8) is taken by the guide posts 12 via springs 14. Since each of the holes 11b is sized slightly greater than the cross-section of the shaft portion of each guide post 12, and since the position of contacts 4 of the micropackage with respect to the contacts 5 of the connector 6 is determined by the mounting frame 10, a shearing stress would otherwise occur between the substrate 3 and heat conductive member 8 due to the weight of the heat exchanger 11 and eventually cause damage in the bonding layer 17. However, the compression by springs 14 not only overcomes the shearing stress, but also limits excessive pressure between contacts 4 and 5.

To maintain the heat conductive member 8 and substrate 3 in a fixed configuration under changing temperature, it is preferred that heat conductive member 8 have a thermal expansion coefficient substantially equal to the thermal expansion coefficient of substrate 3. Therefore, if the substrate 3 is formed of an aluminum oxide ceramic, the heat conductive member 8 comprises molybdenum and tungsten or a sintered block of a mixture of such material as particles of copper. Water-cooling heat exchanger 11 has a plurality of partitions, not shown, which are staggered to form a meandering passageway between a water inlet 15 and an outlet 16.

In operation, heat generated by integrated circuits 2 are conducted through the substrate 3, layer 17 and heat conductive member 8 to the heat exchanger 11. Water is admitted through the inlet 15 to outlet 16 of heat exchanger 11 to transfer thermal energy from the heat conductive member 8 to cooling water. The total value of thermal resistances of the water cooling system between the integrated circuit chips 2 and heat exchanger 11 is made significantly small by establishing pressure contact between the substrate 3 and heat conductive member 8 by the intermediate heat conductive layer 17. Since the heat exchanger 11 can be operated under high liquid pressure, the liquid cooling system of the invention operates at high efficiency.

When replacement or repair is required for micropackage 1, loosening of nuts 13 allows the heat exchanger 11 with heat conductive member 8 attached thereto to be removed from the substrate 3 without the danger of water leakage, allowing the micropackage 1 to be disconnected from connector 6.

FIG. 3 is a modified embodiment of the invention in which a nonfluidic layer 20 of non-cured thermally setting heat conductive silicone compound is laid on a surface of the substrate 3 opposite to the integrated circuit chips 2. This heat conductive layer 20 is surrounded by a wall of silicone rubber 21 which serves as a bond between the heat conductive member 8 and the substrate. To impart thermal conductivity, the silicone compound is a mixture of silicone oil and powder of beryllium oxide or aluminum nitride, or any other thermally conductive materials. Heat conductive layer 20 provides an efficient means for extracting heat from the substrate 3 and conducting it to the heat conductive member 8. During replacement of a micropackage, the thumb nuts 13 and screws 9 are loosened to remove the heat exchanger 11 from the heat conductive member 8.

What is claimed is:

1. A cooling system for an electronic system comprising:
   a connector mounted on a panel;
   an integrated circuit package having a substrate and being removably connectable to said connector;
   a mounting frame for mounting said package into contact with said connector;
   heat exchanger means provided with inlet and outlet means to permit liquid coolant to flow through said heat exchanger means, said heat exchanger means including a heat conductive member;
   a layer of heat conductive bonding material for bonding said heat conductive member to said package to provide a low thermal resistance contact therebetween; and
   a plurality of fastening means mounted on said panel for removably holding said heat exchanger means on said panel, wherein each of said fastening means comprises a guide post having a shaft portion and an externally threaded portion, a nut having an internally threaded portion engaged with said externally threaded portion, and a coil spring between said heat exchanger means and said nut, said coil spring exerting a predetermined amount of pressure on said heat exchanger means when said nut is tightened to contact said shaft portion to promote a reduction in stress on said integrated circuit package substrate and said heat conductive member.

2. A cooling system as claimed in claim 1, wherein said heat exchanger means includes a heat exchange unit having a plurality of throughholes and said heat conductive member has a plurality of screw thread holes in positions corresponding to said throughholes for detachably connecting said heat exchange unit and said heat conductive member together by screws, said heat conductive member being in low thermal resistance contact with said integrated circuit package.

3. A cooling system as claimed in claim 1, wherein said layer comprises nonfluidic silicone compound and a wall of silicone rubber surrounding said silicone compound layer, said silicone rubber wall bonding said integrated circuit package to said heat exchanger means.

4. A cooling system as claimed in claim 2, wherein said layer comprises nonfluidic silicone compound and a wall of silicone rubber surrounding said silicone compound layer, said silicone rubber wall bonding said integrated circuit package to said heat conductive member.

5. A cooling system as claimed in claim 1, wherein said cooling system is vertically oriented, said plurality of fastening means promoting a reduction in shearing stress between said integrated circuit package substrate and said heat conductive member.

* * * * *